United States Patent

Kanma et al.

[11] Patent Number: 5,914,903
[45] Date of Patent: Jun. 22, 1999

[54] SEMICONDUCTOR MEMORY DEVICE

[75] Inventors: Hirokazu Kanma; Akira Takenouchi; Masahiro Tanaka, all of Kasugai, Japan

[73] Assignee: Fujitsu Limited, Kawasaki, Japan

[21] Appl. No.: 09/015,912

[22] Filed: Jan. 30, 1998

[30] Foreign Application Priority Data

May 29, 1997 [JP] Japan ..................................... 9-139741

[51] Int. Cl.$^6$ ..................................................... G11C 7/00
[52] U.S. Cl. ............... 365/203; 365/185.11; 365/185.17; 365/191; 365/230.03; 365/233
[58] Field of Search .............................. 365/203, 230.03, 365/233, 191, 185.11, 185.17

[56] References Cited

U.S. PATENT DOCUMENTS 4,783,764  11/1988  Tsuchiya et al. .............. 365/130.06 X
5,384,745  1/1995   Kouishi et al. ...................... 365/233 X

FOREIGN PATENT DOCUMENTS 62-229596  10/1987  Japan .

*Primary Examiner*—Do Hyun Yoo
*Attorney, Agent, or Firm*—Staas & Halsey

[57] ABSTRACT

A semiconductor memory device includes a plurality of cell blocks each having a plurality of memory cells, a plurality of bit lines for reading data from the individual memory cells, and a precharge circuit for precharging one bit line selected from among the plurality of bit lines in response to a precharge signal. It is determined whether charge in the precharged bit line is to be discharged based on a data content of a memory cell in the cell block selected by a row decoder connected to the bit line. The data content of the selected memory cell in the selected cell block is read out by a potential of the bit line. The memory device further includes at least one gate switching element connected in series to the memory cells of each of the cell blocks. The gate switching element, together with the memory cells of each cell block, forms a series circuit which has one end connected to an associated one of the bit lines and a second end connected to a low-voltage power supply. A mode setting circuit enables the gate switching element during precharging in a fast data reading mode, and disables the gate switching element during precharging in a slow data reading mode.

9 Claims, 11 Drawing Sheets

SEMICONDUCTOR MEMORY DEVICE

BACKGROUND OF THE INVENTION

The present invention relates generally to a semiconductor memory device and a control apparatus, and, more particularly, to a data reading operation thereof.

Recently, faster data processing and lower power dissipation for electronic devices is in high demand. There is, therefore, a demand for faster data operation and lower power dissipation for semiconductor memory devices, one of various kinds of semiconductor integrated circuit devices installed in electronic devices.

FIG. 1 shows the essential portions of an ordinary read only semiconductor memory device (hereinafter referred to as "ROM") 60 which is installed in various types of electronic devices. The ROM 60 has memory cells of a NAND type. A plurality of cell blocks 61 are connected between a bit line BL and a low-voltage power supply GND. Each cell block 61 includes a single block select transistor comprised of an enhancement type N-channel MOS (NMOS) transistor, and three memory transistors.

There are two data reading operations for the ROM 60. One is a precharge operation and the other is a read operation which is performed after the precharge operation to read data.

When the precharge operation is initiated, a column switch 62 is set on to select a bit line BL, a cell block 61 is selected by a block select signal SL and a precharge P-channel MOS (PMOS) transistor 63 connected to a data line DL is enabled by a precharge signal PRE.

As shown in FIG. 2, as a current from a high-voltage power supply Vcc flows in the bit line BL, the bit line BL is precharged so that the potential of the bit line BL rises to a high potential. When the precharge signal PRE is disabled to terminate the precharge operation, the operation goes to the read operation.

In the read operation, when data in the memory transistor in the selected cell block 61 which is selected by a word signal is "0", the selected cell block 61 becomes conductive. This causes charges in the bit line BL to be discharged to the level of a low-voltage power supply GND via the selected cell block 61. Therefore, the potential of the bit line BL becomes a low potential (hereinafter called "L level"). The L-level potential of the bit line BL is output to an external unit as read data of "0" via an unillustrated sense amplifier connected to the data line DL.

In the read operation, when data in the selected memory transistor is "1", the selected cell block 61 becomes nonconductive. Therefore, charges in the bit line BL will not be discharged to the level of the low-voltage power supply GND via the selected cell block 61. In this case, the potential of the bit line BL becomes a high potential (hereinafter called "H level"). The H-level potential of the bit line BL is output to the external unit as read data of "1" via the unillustrated sense amplifier connected to the data line DL.

FIG. 3 shows the essential portions of another typical ROM 70. The ROM 70, like the ROM 60, has memory cells of a NAND type. Each cell block 71 includes a single block select transistor comprised of an enhancement type N-channel MOS (NMOS) transistor, three memory transistors, and a single discharge transistor.

When the precharge operation of the ROM 70 is initiated, a column switch 72 is set on to select a bit line BL, a cell block 71 is selected by a block select signal SL and a precharge PMOS transistor 73 connected to a data line DL is enabled by a precharge signal PRE. At this time, the discharge transistor is set off by a discharge signal XPRE.

As shown in FIG. 4, as a current from a high-voltage power supply $V_{CC}$ flows in the bit line BL, the bit line BL is precharged so that the potential of the bit line BL rises to a high potential. When a precharge cycle ends by disabling the precharge signal PRE, the discharge transistor is set on by a discharge signal XPRE and the operation goes to the read operation.

In the read operation, when data in the memory transistor in the selected cell block 71 which is selected by a word signal is "0", the selected cell block 71 becomes conductive. This causes charges in the bit line BL to be discharged to the level of a low-voltage power supply GND via the selected cell block 71. Therefore, the potential of the bit line BL becomes an L level. The L-level potential of the bit line BL is output to an external unit as read data of "0" via an unillustrated sense amplifier connected to the data line DL.

In the read operation, when data in the memory transistor in the selected cell block 71 which is selected by the word signal is "1", the selected cell block 71 becomes nonconductive. Therefore, charges in the bit line BL will not be discharged to the level of the low-voltage power supply GND via the selected cell block 71. In this case, the potential of the bit line BL becomes an H level. The H-level potential of the bit line BL is output to the external unit as read data of "1" via the unillustrated sense amplifier connected to the data line DL.

In the ROM 60 shown in FIG. 1, charges in the bit line BL are discharged to the level of the low-voltage power supply GND via the selected cell block 61 even in the precharge operation when data in the selected memory transistor is "0". In the read operation, therefore, the potential of the bit line BL becomes an L level quickly. As a result, the ROM 60 can shorten the time for establishing data and is thus suitable for a fast operation. Because discharging is carried out in the ROM 60 even in the precharge operation, however, the ROM suffers large current consumption which becomes a problem particularly in a slow operation.

In the ROM 70 shown in FIG. 3, by contrast, when data in the selected memory transistor is "0", charges in the bit line BL are not discharged to the level of the low-voltage power supply GND via the selected cell block 71 until the precharge operation is finished. The ROM 70 is therefore advantageous over the ROM 60 in FIG. 1 in reducing the current consumption.

Because no discharge is performed in the ROM 70 in the precharge operation, however, the bit line BL is charged up to the level of the high-voltage power supply $V_{CC}$. When the discharge transistor is turned on to read data of "0" from the selected memory transistor in the read operation, the discharging starts at the level of the high-voltage power supply $V_{CC}$. It therefore takes a long time for the potential of the bit line BL to reach the L level. The ROM 70 thus needs a longer time to establish data and is thus, not suitable for a fast operation.

As previously discussed, various kinds of electronic devices demand low power dissipation and high speed. To meet this demand, only the minimum essential semiconductor integrated circuit devices are enabled when each electronic device is not in use, and the operational speed of the enabled semiconductor integrated circuit devices is set low, thereby decreasing the current dissipation. It would therefore be desirable to have a ROM which can operate both fast and slowly.

As mentioned above, however, the conventional ROM 60 shown in FIG. 1 cannot provide a reduction in power consumption in a slow operation mode. By contrast, the conventional ROM 70 shown in FIG. 3 is not suitable for a fast operation.

SUMMARY OF THE INVENTION

Accordingly, it is an object of the present invention to provide a semiconductor memory device capable of selecting both fast and slow operations and suppressing current consumption in a slow operation mode, and a control apparatus and a data reading method for this semiconductor memory device.

A semiconductor memory device according to the invention comprises a plurality of cell blocks each having a plurality of memory cells, a plurality of bit lines for reading data from the individual memory cells, and a precharge circuit for precharging one bit line selected from among the plurality of bit lines in response to a precharge signal. It is determined whether or not charges in the precharged bit line are to be discharged based on a data content of a memory cell in that cell block which is selected by a row decoder connected to that bit line, thereby causing the data content of the selected memory cell in the selected cell block to be read out by a potential of the bit line. The semiconductor memory device further includes at least one gate switching element connected in series to the at least one memory cells of each of the cell blocks. The gate switching element together with the at least one memory cells of each cell block forms a series circuit which has one end connected to an associated one of the bit lines and a second end connected to a low-voltage power supply. The semiconductor memory device further has a mode setting circuit for enabling the gate switching element during precharging in a fast data reading mode, and disabling the gate switching element during precharging in a slow data reading mode.

A method of reading data from a semiconductor memory device according to the present invention provides, after a bit line is precharged in response to a precharge signal, it is determined whether or not charges in the precharged bit line are to be discharged based on a data content of a memory cell connected to the precharged bit line and selected by a row decoder, thereby causing the data content of the selected memory cell to be read by a potential of the bit line. In a fast data reading mode, discharging of charges in a bit line is enabled during precharging of that bit line based on the data content of the selected memory cell, and data is read from the selected memory cell after precharging. In a slow data reading mode, discharging of charges in a bit line is disabled during precharging of that bit line regardless of the data content of the selected memory cell, and data is read from the selected memory cell after precharging.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
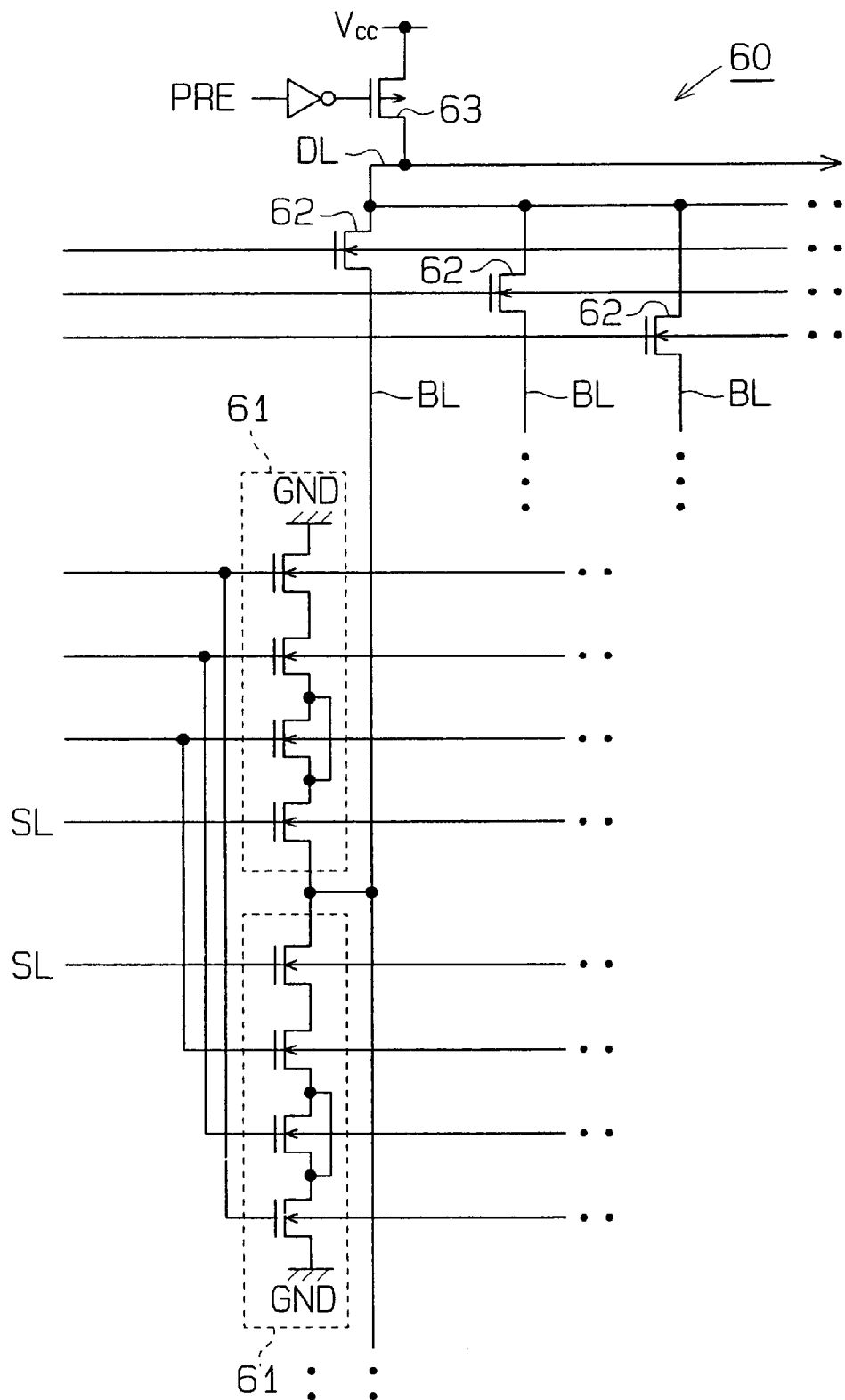
FIG. 1 is a circuit diagram showing the essential parts of a conventional ROM.
Figure 2:
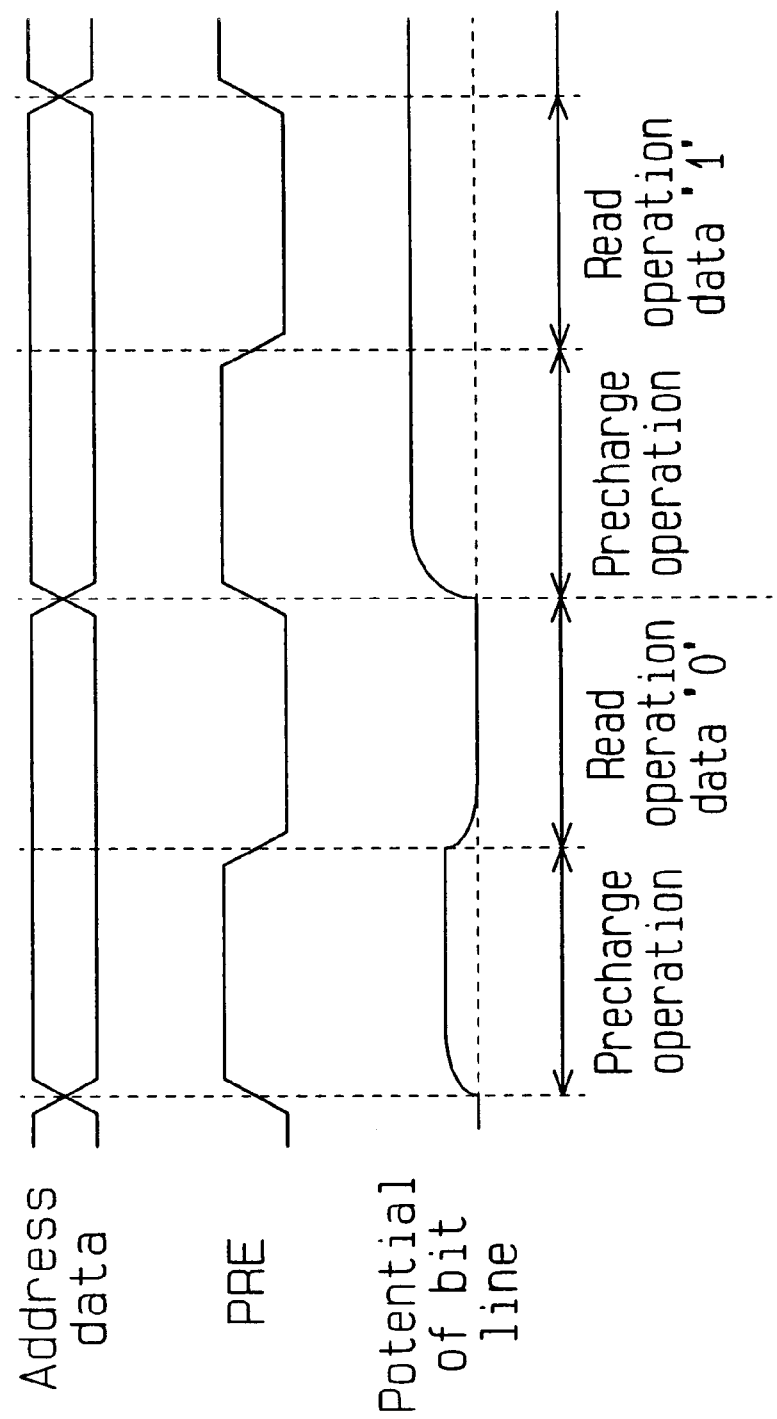
FIG. 2 is a time chart explaining the operation of the conventional ROM of FIG. 1.
Figure 3:
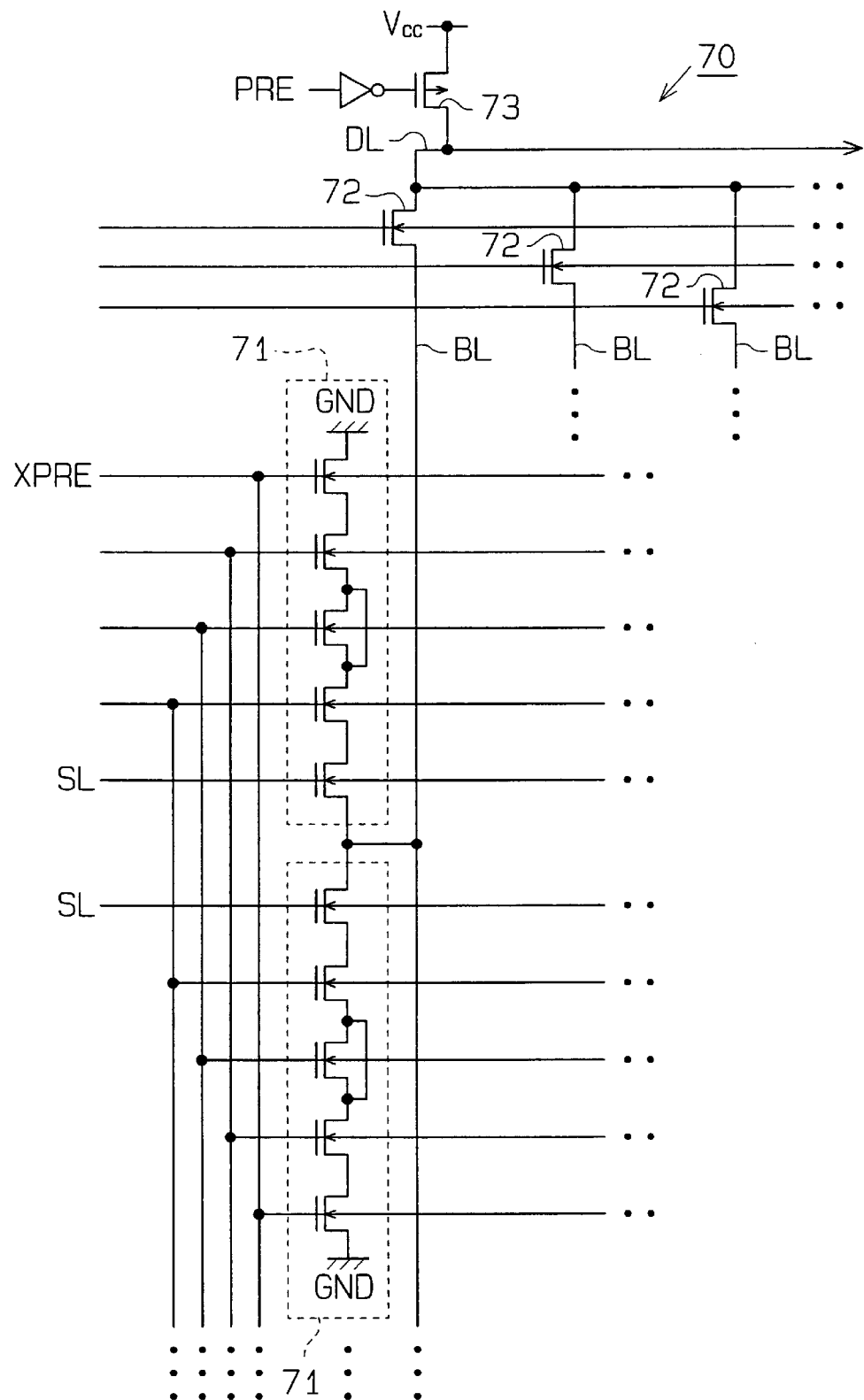
FIG. 3 is a circuit diagram showing the essential parts of a conventional ROM having a discharge transistor.
Figure 4:
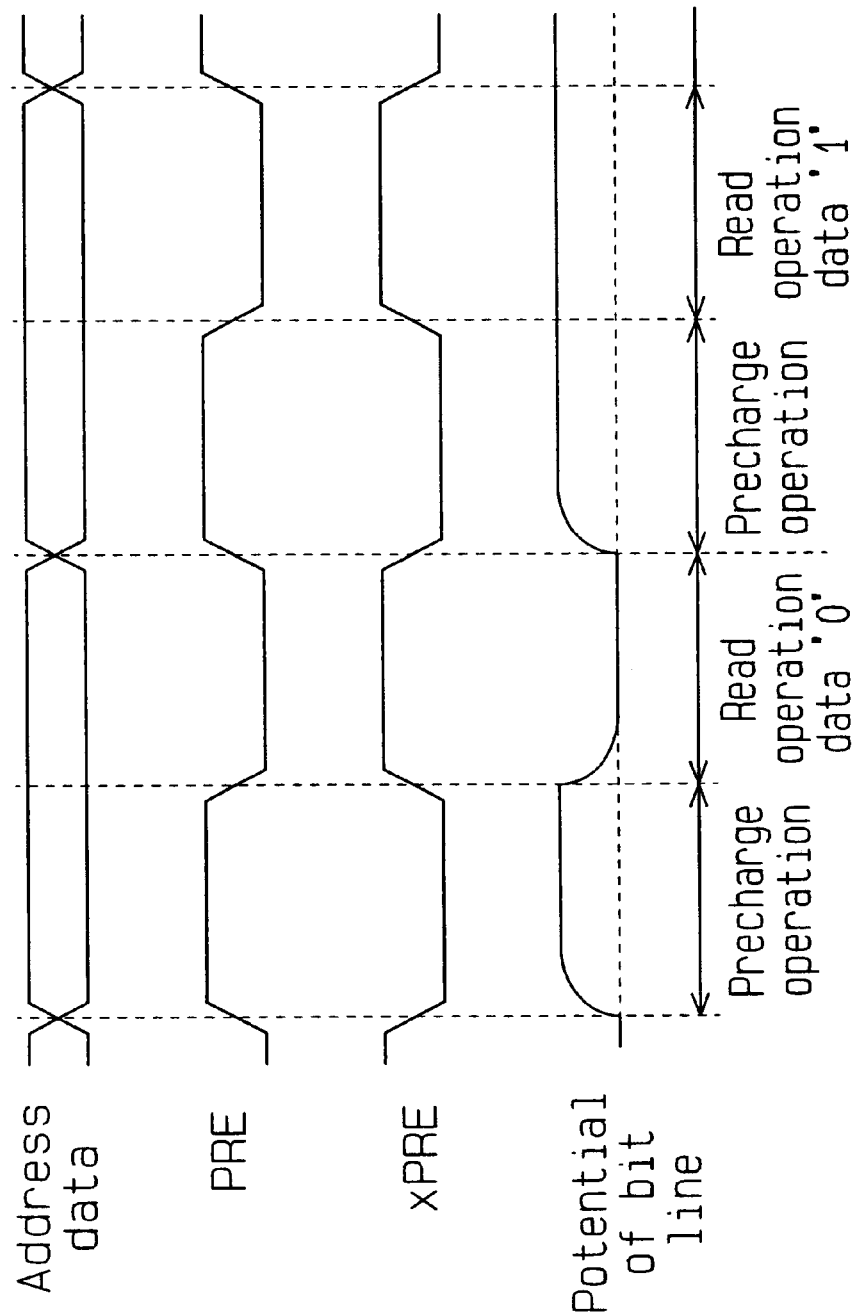
FIG. 4 is a time chart explaining the operation of the conventional ROM having the discharge transistor.
Figure 5:
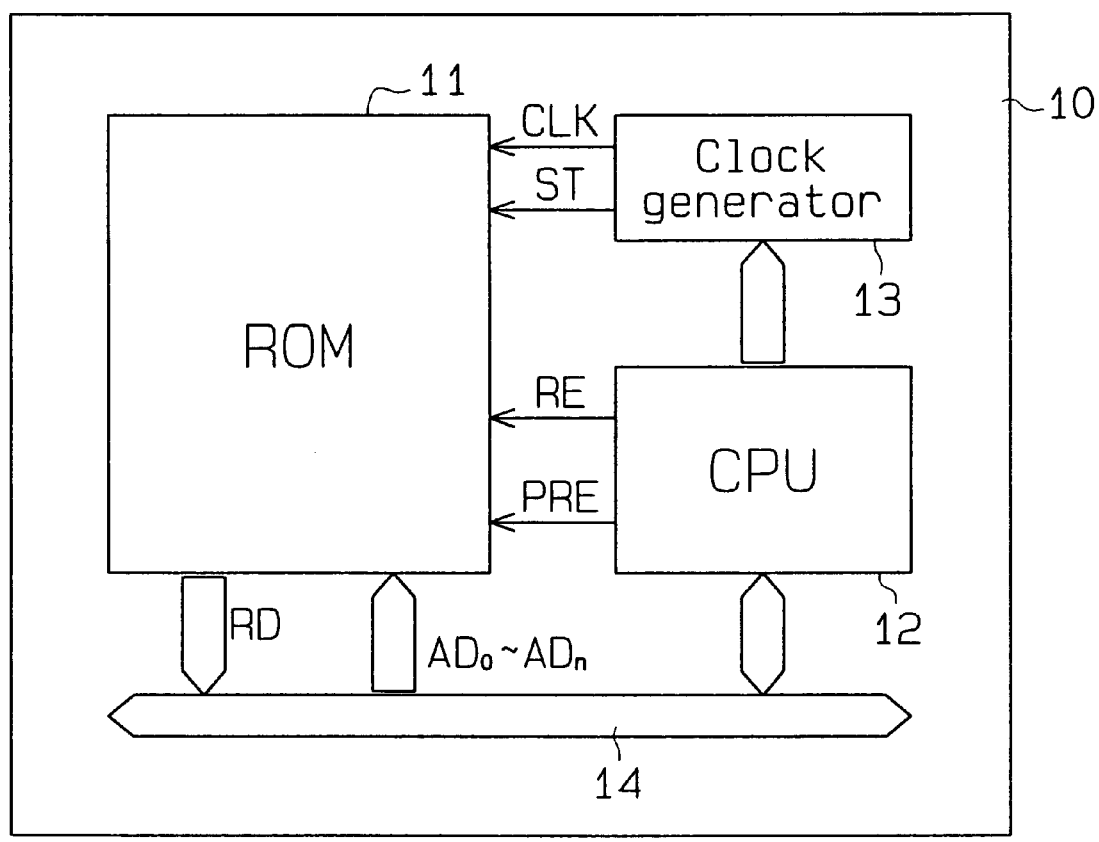
FIG. 5 is a system block diagram of a ROM according to a first embodiment of the present invention.

FIG. 5 shows a diagram of a system for operating a read only semiconductor memory device. In FIG. 5, an electronic device 10 has a read only semiconductor memory device (hereinafter called "ROM") 11, a central processing unit (CPU) 12 and a clock generator 13 as a signal generating circuit.

The CPU 12 receives read data from the ROM 11 via a data bus 14 and exchanges data with an unillustrated external unit. The CPU 12 supplies a read enable signal RE and a precharge signal PRE to the ROM 11. The CPU 12 also sends various kinds of control signals to the clock generator 13.

The clock generator 13 generates a clock CLK and an operation-mode setting signal ST based on various kinds of control signals and sends them to the ROM 11. The clock CLK is used to determine a data read cycle (including a precharge operation and a read operation) for reading data. The operation-mode setting signal ST designates a fast mode when it is at an L level, and designates a slow mode when it is at an H level. When the operation-mode setting signal ST designates the fast mode, the ROM 11 performs a read operation fast. When the operation-mode setting signal ST designates the slow mode, on the other hand, the ROM 11 performs a slow read operation.

When the operation-mode setting signal ST indicates the fast mode, the clock generator 13 generates the clock CLK which has a short period corresponding to the fast mode of the ROM 11. When the operation-mode setting signal ST indicates the slow mode, on the other hand, the clock generator 13 generates the clock CLK which has a long period corresponding to the slow mode of the ROM 11.

The ROM 11 is switched to an operational state from a non-operational state based on the read enable signal RE from the CPU 12, setting the data reading mode. When the data reading mode is set, the ROM 11 performs a precharge operation in response to the precharge signal PRE. The data read cycle is determined based on the clock CLK from the clock generator 13, and the ROM 11 is set to the fast mode or the slow mode based on the operation-mode setting signal ST. Based on the aforementioned signals and an address signal $AD_0$–$AD_n$ from the data bus 14, data is read from a memory cell at the address designated by the address signal. The read data is then sent to the CPU 12 and/or the external unit via the data bus 14, as known by those of ordinary skill in the art.

Figure 6:
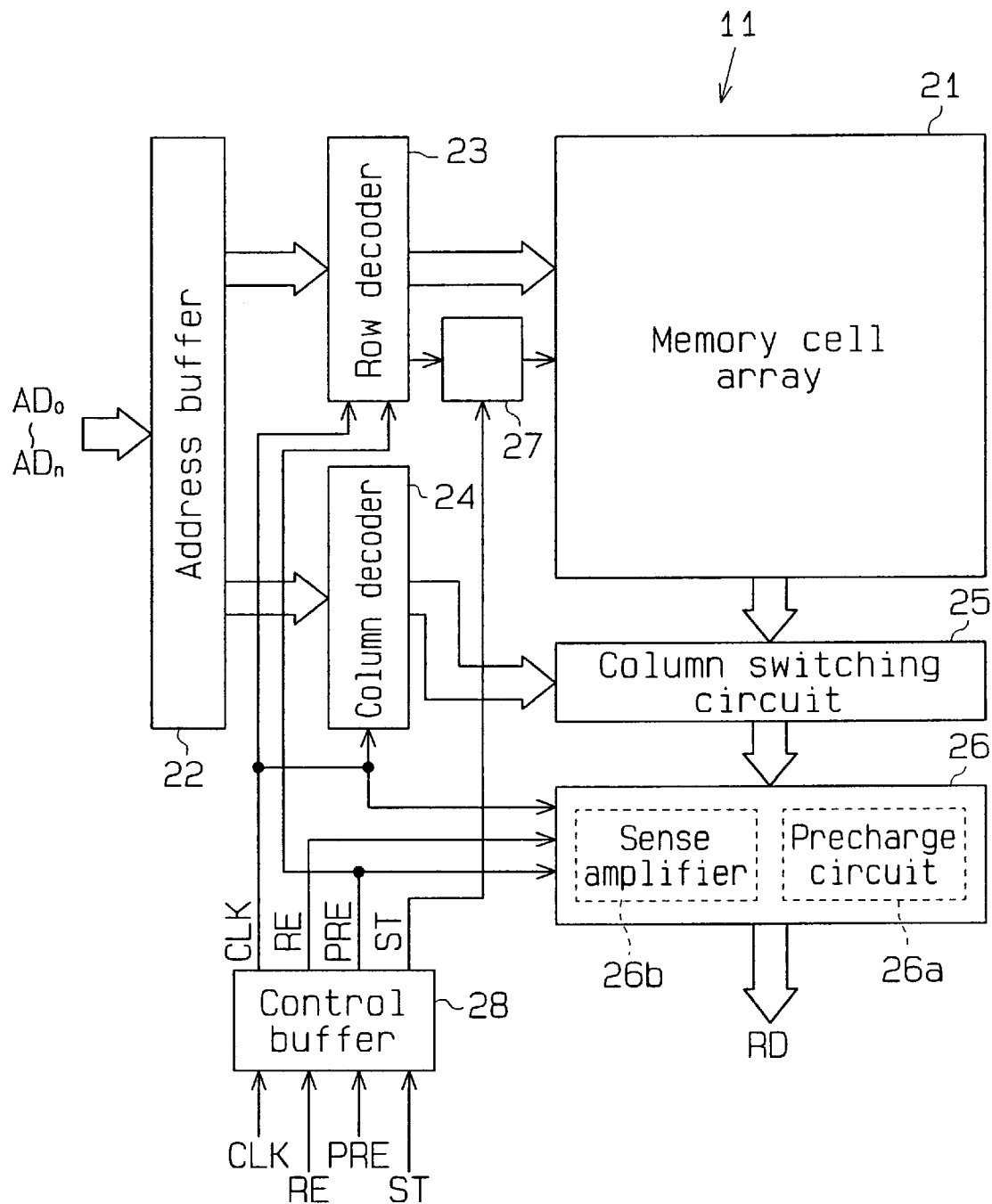
FIG. 6 is a block diagram of the ROM of FIG. 5.

FIG. 6 is a more detailed block diagram of the ROM 11. The ROM 11 includes a memory cell array 21, an address buffer 22, a row decoder 23, a column decoder 24, a column switching circuit 25, a precharge/output circuit 26, a mode setting circuit 27 and a control buffer 28.

Figure 7:
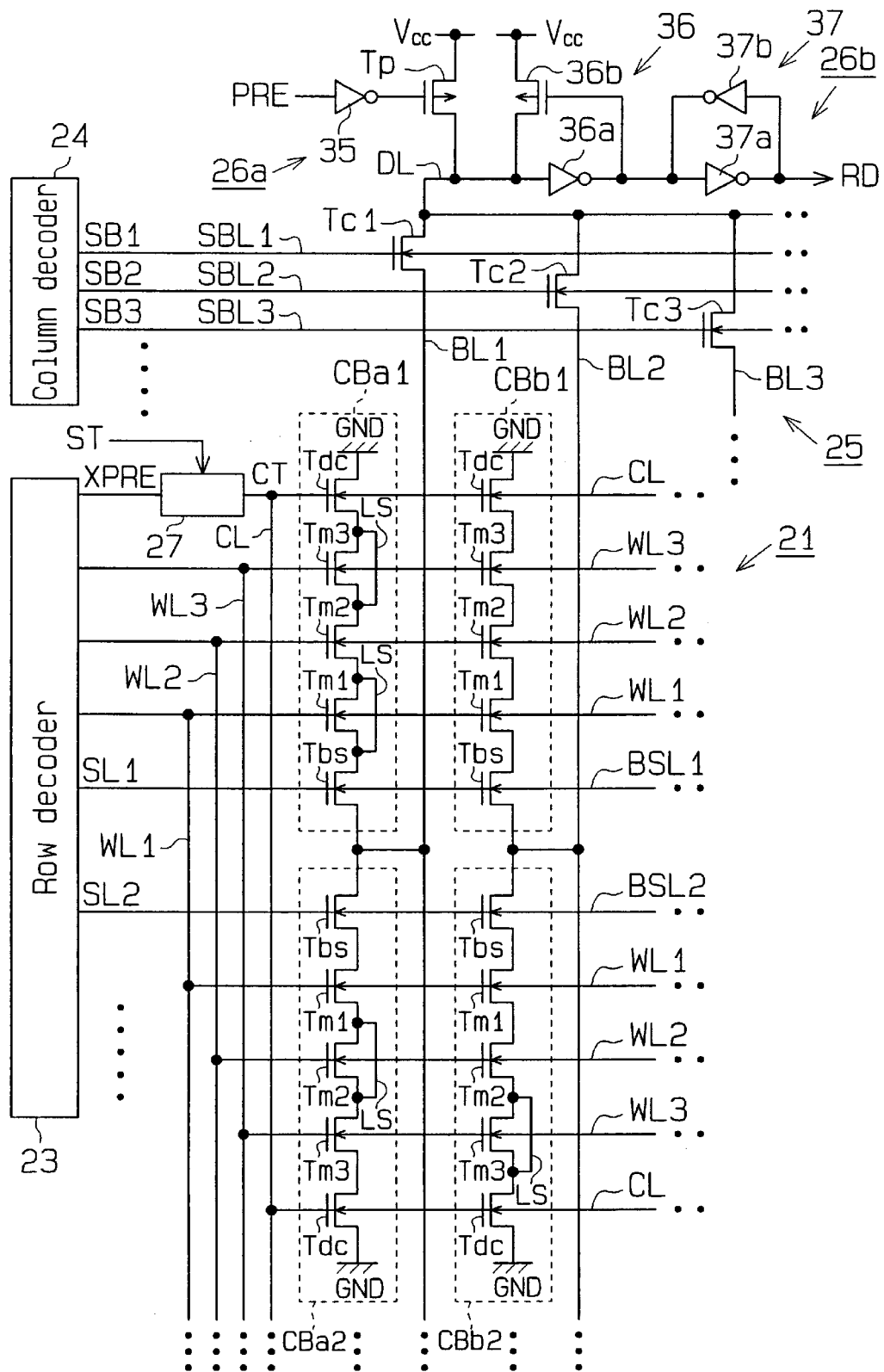
FIG. 7 is a circuit diagram of the essential parts of the ROM of FIG. 5.

FIG. 7 shows the essential parts of the memory cell array 21 and some of its peripheral circuitry. The memory cell array 21 preferably takes a form of a NAND type circuit. The memory cell array 21 is provided with a plurality of bit lines. FIG. 7 shows three bit lines BL1, BL2 and BL3 for the sake of descriptive convenience. A plurality of cell blocks are connected to each bit line. FIG. 7 depicts two cell blocks CBa1 and CBa2 connected to the bit line BL1, and two cell blocks CBb1 and CBb2 connected to the bit line BL2 for the sake of descriptive convenience.

In the present embodiment, each of the cell blocks CBa1, CBa2, CBb1 and CBb2 has a block select transistor Tbs, first to third memory transistors Tm1 to Tm3, and a discharge transistor Tdc. All of the transistors TbS, Tm1–Tm3, and Tdc comprise an enhancement type N-channel MOS (NMOS) transistor.

The first to third memory transistors Tm1–Tm3 in each of the cell blocks CBa1, CBa2, CBb1 and CBb2 are connected in series. The first memory transistor Tm1 has a drain connected to the source of the block select transistor Tbs whose drain is connected to the associated bit line BL1 or BL2. The source of the third memory transistor Tm3 is connected to the drain of the discharge transistor Tdc whose source is connected to a low-voltage power supply GND.

Further, each block select transistor Tbs has a gate connected to an associated block select line BSL1 or BSL2. Each first memory transistor Tm1 has a gate connected to a first word line WL1. Each second memory transistor Tm2 has a gate connected to a second word line WL2. Each third memory transistor Tm3 has a gate connected to a third word line WL3. Each discharge transistor Tdc has a gate connected to a control line CL.

Each cell block CBa1, CBa2, CBb1 or CBb2 is selected when the block select transistor Tbs in that block is turned on. In the selected block, two of the first to third word lines WL1–WL3 are not selected, and the remaining one is selected. The non-selected word lines go to H levels, and the selected word line goes to an L level. Therefore, the memory transistors which are connected to non-selected word line are turned on, while the memory transistor which is connected to selected word line is turned off.

When the source and drain of each disabled memory transistor are short-circuited, i.e., when data in that memory transistor is "0", the series circuit of the first to third memory transistors Tm1–Tm3 becomes conductive. When the source and drain of each disabled memory transistor are not short-circuited, i.e., when data in that memory transistor is "1", on the other hand, the series circuit of the first to third memory transistors Tm1–Tm3 becomes nonconductive.

According to the present embodiment, in FIG. 7, each of the first and third memory transistors Tm1 and Tm3 in the cell block CBa1, the second memory transistor Tm2 in the cell block CBa2 and the third memory transistor Tm3 in the cell block CBb2 has the source and drain short-circuited by a line LS. Therefore, data "0" is written in any memory transistor whose source and drain are connected together by the line LS. On the other hand, data "1" is written in any memory transistor whose source and drain are not connected together by the line LS.

The bit lines BL1, BL2 and BL3 are connected to the data line DL via respective column switches Tc1, Tc2 and Tc3 in the column switching circuit 25. Preferably, each of the column switches Tc1–Tc3 comprises an enhancement NMOS transistor. Connected to the gates of the column switches Tc1–Tc3 are respective bit-line select lines SBL1, SBL2 and SBL3. When one of the column switches Tc1–Tc3 is selected and is switched on, the bit line that is associated with the enabled column switch alone is connected to the data line DL.

The address buffer 22 shown in FIG. 6 receives address data $AD_0$–$AD_n$ from the data bus 14 in FIG. 5, and outputs row address data in the address data $AD_0$–$AD_n$ to the row decoder 23. The address buffer 22 outputs column address data in the address data $AD_0$–$AD_n$ to the column decoder 24.

The row decoder 23 shown in FIG. 7 is connected to the first to third word lines WL1–WL3 and the block select lines BSL1 and BSL2 of the memory cell array 21. The row decoder 23 decodes row address data in synchronism with the clock CLK, which is input via the control buffer 28 in FIG. 6, and selects the cell block corresponding to the row address data and the memory transistors in that cell block. When the cell block CBa1 is selected in FIG. 7, for example, the row decoder 23 sends a block select signal SL1 of an H level to the block select line BSL1, and a block select signal SL2 of an L level to the block select line BSL2. When the first memory transistor Tm1 in the cell block CBa1 is selected, the row decoder 23 sends an H-level word signal to the second and third word lines WL2 and WL3 and an L-level word signal to the first word line WL1.

In other words, the row decoder 23 sets only the word line connected to the memory transistor that is selected based on row address data to an L level, and sets the remaining word lines which are not selected to an H level. As a result, the memory transistor selected based on the row address data is turned off, while the other, unselected memory transistors are turned on.

In a disabled memory transistor, when the line LS is connected between the source and drain in the memory transistor, i.e., in the case of a memory transistor where data of "0" is written, the series circuit of the first to third memory transistors Tm1–Tm3 including the selected memory transistor becomes conductive. In a disabled memory transistor, when the line LS is not connected between the source and drain in the memory transistor, i.e., in the case of a memory transistor where data of "1" is written, on the other hand, the series circuit of the first to third memory transistors Tm1–Tm3 including the selected memory transistor becomes nonconductive.

The row decoder 23 receives the precharge signal PRE via the control buffer 28. The row decoder 23 generates an inverted signal obtained by inverting the level of the precharge signal PRE, and sends the inverted signal as the discharge signal XPRE to the mode setting circuit 27. The discharge signal XPRE is therefore complementary to the precharge signal PRE.

Figure 8:
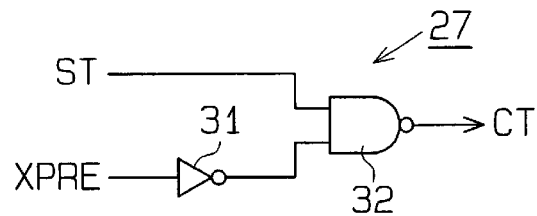
FIG. 8 is a block circuit diagram of a mode setting circuit.

FIG. 8 depicts a block diagram of the mode setting circuit 27. The mode setting circuit 27 has an inverter 31 and a NAND gate 32. The inverter 31 inverts the discharge signal XPRE input from the row decoder 23 and sends the inverted signal to the NAND gate 32. The NAND gate 32 also receives the operation-mode setting signal ST via the control buffer 28. The output terminal of the NAND gate 32 is connected to the control line CL in FIG. 7.

When the operation-mode setting signal ST indicates the fast mode (at an L level), the NAND gate 32 outputs the H-level control signal CT irrespective of the level of the discharge signal XPRE. When the operation-mode setting signal ST indicates the slow mode (at an H level), the NAND gate 32 outputs the L-level control signal CT when the discharge signal XPRE has the L level and outputs the H-level control signal CT when the discharge signal XPRE has the H level.

As shown in FIG. 7, the mode setting circuit 27 is connected to the control line CL of the memory cell array 21. The control signal CT output from the NAND gate 32 in FIG. 8 is sent onto the control line CL.

Figure 9:
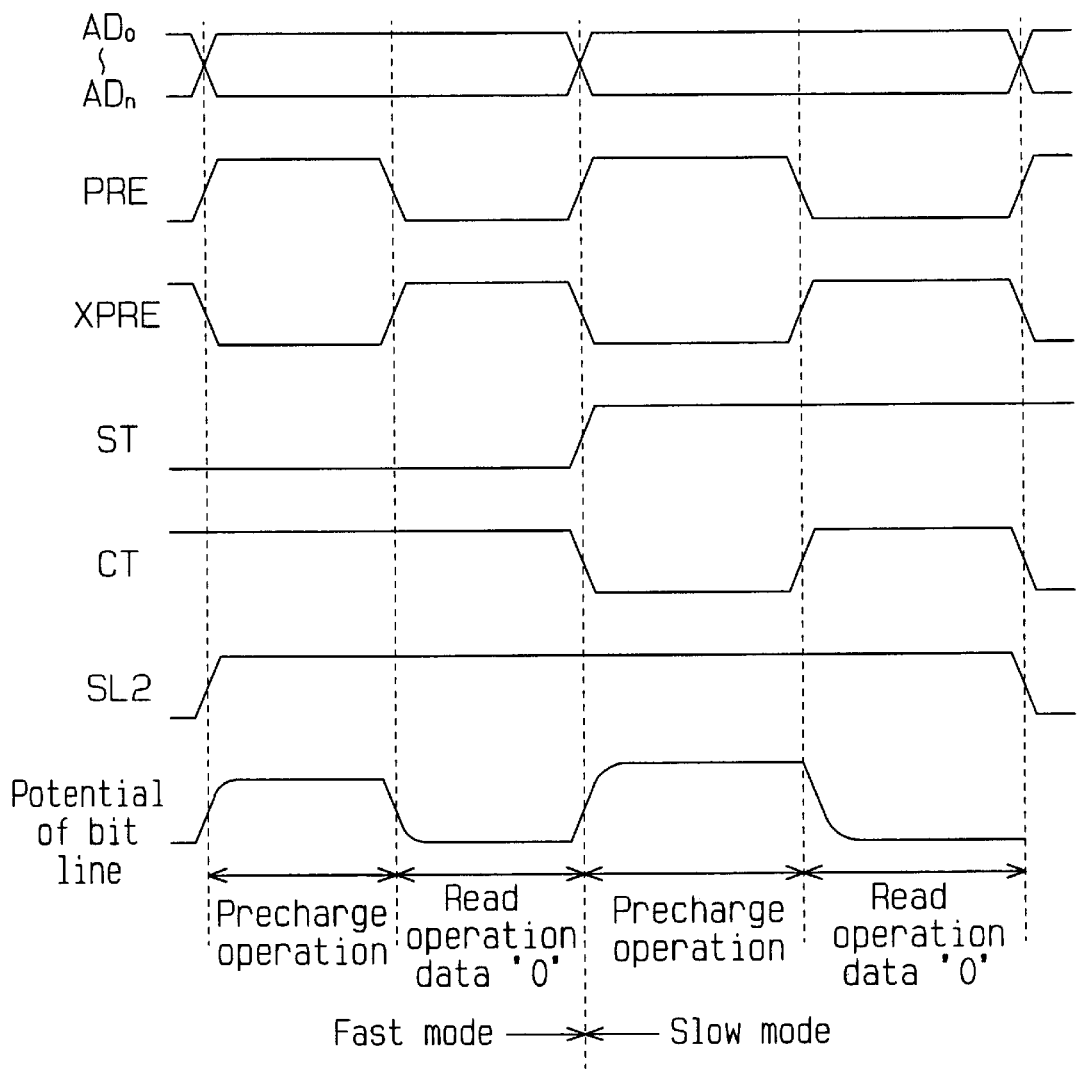
FIG. 9 is a time chart explaining the operation of the ROM of FIG. 7.

As shown in FIG. 9, as the control signal CT is always at the H level in the fast mode, the discharge transistor Tdc in each cell block is set on regardless of the level of the discharge signal XPRE (precharge signal PRE).

As the control signal CT has two stages of an H level and L level in the slow mode, the discharge transistor Tdc is turned on when the discharge signal XPRE has the H level (the precharge signal PRE being at the L level). When the discharge signal XPRE has the L level (the precharge signal PRE being at the H level), the discharge transistor Tdc is turned off.

The column decoder 24 is connected to the bit-line select lines SBL1–SBL3 of the column switching circuit 25. The column decoder 24 decodes column address data in synchronism with the clock CLK, which is input via the control buffer 28, and selects the bit line corresponding to the column address data. When the cell block CBa1 is selected in FIG. 7, for example, the column decoder 24 sends a bit-line select signal SB1 of an H level to the bitline select line SBL1, and the bit-line select signals SB2 and SB3 both of an L level to the other bit-line select lines SBL2 and SBL3. This connects the bit line BL1, to which the cell block CBa1 is connected, to the data line DL.

The data line DL shown in FIG. 7 is connected to the precharge/output circuit 26. The precharge/output circuit 26 has a precharge circuit 26a and a sense amplifier 26b. As shown in FIG. 7, the precharge circuit 26a has a precharge transistor Tp which preferably comprises an enhancement type P-channel MOS (PMOS) transistor, and an inverter 35. The precharge transistor Tp has a drain connected to the data line DL and a source connected to a high-voltage power supply $V_{CC}$. The precharge transistor Tp further has a gate connected to the output terminal of the inverter 35. The precharge signal PRE is supplied via the control buffer 28 to the input terminal of the inverter 35.

The sense amplifier 26b comprises an amplifier 36 and a latch circuit 37 as shown in FIG. 7. The amplifier 36 comprises an inverter 36a and an enhancement type PMOS transistor 36b. The amplifier 36 inverts and amplifies read data RD output onto the data line DL, and sends the amplified data to the latch circuit 37 at the subsequent stage. The latch circuit 37, which has two inverters 37a and 37b, latches the amplified read data RD and places it on the data bus 14.

The operation of the ROM 11 will now be discussed.

Fast Mode

In fast mode, the CPU 12 provides the clock generator 13 with a control signal for permitting the fast operation of the ROM 11. In response to the control signal, the clock generator 13 sends the clock CLK having a short period and the L-level operation-mode setting signal ST to the ROM 11.

As the L-level operation-mode setting signal ST is supplied to the NAND gate 32 in the mode setting circuit 27, the mode setting circuit 27 always sends the H-level control signal CT to the control line CL. Therefore, the discharge transistors Tdc of the individual cell blocks CBa1, CBa2, CBb1 and CBb2 are set on.

A description will now be given of a case where, for example, address data $AD_0$–$AD_n$ for selecting the second memory transistor Tm2 in the cell block CBa2 connected to the bit line BL1 is input to the ROM 11 in the fast mode.

1. Precharge Operation

In FIG. 7, the column decoder 24 sends the H-level bit-line select signal SB1 to the bit-line select line SBL1, and sends the L-level bit-line select signals SB2 and SB3 to the other bit-line select lines SBL2 and SBL3. As a result, the column switch Tc1 is turned on, connecting the bit line BL1 to the data line DL and the column switches Tc2 and Tc3 are turned off, so that the bit line BL2 and BL3 are not connected to the data line DL.

The row decoder 23 sends the H-level block select signal SL2 to the block select line BSL2 and sends the L-level block select signal SL1 to the block select line BSL1. Further, the row decoder 23 sends the H-level word signal to the first and third word lines WL1 and WL3 and sends the L-level word signal to the second word line WL2. Consequently, the block select transistor Tbs and the first and third memory transistors Tm1 and Tm3 in the cell block CBa2 are turned on. Since the second memory transistor Tm2 in the cell block CBa2 has its source and drain connected by the line LS, the series circuit in the cell block CBa2 is conductive.

The H-level precharge signal PRE is supplied via the inverter 35 to the precharge transistor Tp so that the precharge transistor Tp is turned on. The ON action of the precharge transistor Tp causes the current from the high-voltage power supply $V_{CC}$ to flow into the bit line BL1 via the precharge transistor Tp and the column switch Tc1, initiating precharging.

As the series circuit in the selected cell block CBa2 is conductive at this time and the data in the selected second memory transistor Tm2 in that cell block CBa2 is "0", charge in the bit line BL1 is discharged to the level of the low-voltage power supply GND via the cell block CBa2. As shown in FIG. 9, the potential of the bit line BL1, though precharged, stays at a low level and does not go to as high a level as that of the high-voltage power supply $V_{CC}$.

2. Read Operation

When the precharge signal PRE is switched to an L level from the H level, the precharge operation ends and a read operation starts. When the precharge signal PRE goes to the L level, the precharge transistor Tp is turned off. The OFF action of the precharge transistor Tp shuts off the flow of the current to the bit line BL1 from the high-voltage power supply $V_{CC}$. Therefore, the charge in the bit line BL1 is discharged via the cell block CBa2. Consequently, the potential of the bit line BL1 drops to an L level. As the potential of the bit line BL1 stays at a low level though precharged, the potential of the bit line BL1 quickly drops to the L level in the read operation. The L-level potential is output as read data RD via the amplifier 36 and the latch circuit 37.

When data "0" is read, as mentioned above, the potential of the bit line BL1 has dropped low before reading, which decreases the time required for establishing valid data. It is thus possible to carry out data reading in the fast mode.

Note that when data "1" is read, no discharge is performed during the precharge operation. The potential of the bit line has reached the same level as that of the high-voltage power supply $V_{CC}$, similarly shortening the time for establishing data "1" and ensuring data reading in the fast mode.

When data of "0" is read in fast mode, discharging is performed, which consumes the current, in the precharge operation, and the precharging time in fast mode is shorter than the precharging time in slow mode. The current consumed during one cycle in fast mode is therefore smaller than that in the case of reading data of "0" in slow mode.

Slow Mode

In slow mode, the CPU 12 provides the clock generator 13 with a control signal for permitting the slow operation of the ROM 11. In response to the control signal, the clock generator 13 sends the clock CLK having a long period and the H-level operation-mode setting signal ST to the ROM 11.

Then, the H-level operation-mode setting signal ST is supplied to the NAND gate 32 in the mode setting circuit 27. Consequently, the mode setting circuit 27 alternately sends to the control line CL the H-level control signal CT when the discharge signal XPRE is at the H level (the precharge signal PRE at the L level), and the L-level control signal CT when the discharge signal XPRE is at the L level (the precharge signal PRE at the H level). In the precharge operation, therefore, the L-level control signal CT is supplied to the control line CL, setting the discharge transistors Tdc of the cell blocks CBa1, CBa2, CBb1 and CBb2 off. In the read operation, the H-level control signal CT is supplied to the control line CL, setting the discharge transistors Tdc of the cell blocks CBa1, CBa2, CBb1 and CBb2 on.

A description will now be given of a case where, for example, address data $AD_0$–$AD_n$ for selecting the third memory transistor Tm3 in the cell block CBb2 connected to the bit line BL2 is input to the ROM 11 in the slow mode.

1. Precharge Operation

In FIG. 7, the column decoder 24 sends the H-level bit-line select signal SB2 to the bit-line select line SBL2, and sends the L-level bit-line select signals SB1 and SB3 to the other bit-line select lines SBL1 and SBL3. As a result, the column switch Tc2 is turned on and the column switches Tc1 and Tc3 are turned off, connecting only the bit line BL2 to the data line DL.

The row decoder 23 sends the H-level block select signal SL2 to the block select line BSL2 and sends the L-level block select signal SL1 to the block select line BSL1. Further, the row decoder 23 sends the H-level word signal to the first and second word lines WL1 and WL2 and sends the L-level word signal to the third word line WL3. Consequently, the block select transistor Tbs and the first and second memory transistors Tm1 and Tm2 in the cell block CBb2 are turned on. The third memory transistor Tm3 in the cell block CBb2 has its source and drain connected by the line LS.

The H-level precharge signal PRE is supplied via the inverter 35 to the precharge transistor Tp so that the precharge transistor Tp is turned on.

As the precharge transistor Tp is turned on, the current from the high-voltage power supply $V_{CC}$ flows into the bit line BL2 via the precharge transistor Tp and the column switch Tc2, initiating precharging. As the discharge transistor Tdc in the selected cell block CBb2 is set off at this time, charge in the bit line BL2 is not discharged to the level of the low-voltage power supply GND via the cell block CBb2. As shown in FIG. 9, therefore, the potential of the bit line BL2 rises and approaches the level of the high-voltage power supply $V_{CC}$.

In the precharge operation in slow mode, therefore, the current which flows into the bit line BL2 from the precharge transistor Tp via the selected cell block CBb2 is not discharged, which suppresses current consumption in the precharge operation.

2. Read Operation

When the precharge signal PRE is switched to an L level from the H level, the precharge operation ends and a read operation starts. When the precharge signal PRE goes to the L level, the precharge transistor Tp is turned off. The discharge transistor Tdc is turned on.

The OFF action of the precharge transistor Tp inhibits the flow of the current to the bit line BL1 from the high-voltage power supply $V_{CC}$. Since the discharge transistor Tdc is controlled and set on to render the series circuit in the selected cell block CBb2 conductive (as the data in the selected third memory transistor Tm3 in the cell block CBb2 is "0"), charge in the bit line BL2 is discharged to the level of the low-voltage power supply GND via the cell block CBb2. Consequently, the potential of the bit line BL2 drops to an L level. The L-level potential is output as read data RD via the sense amplifier 36 and the latch circuit 37.

When data "0" is read, the potential of the bit line BL2 is discharged from a high potential close to that of the high-voltage power supply $V_{CC}$, so that the time for establishing data becomes longer than that in fast mode. This data-establishing time is, however, sufficient for reading data in slow mode.

Note that when data "1" is read, no discharge is performed during the precharge operation. The potential of the bit line has therefore reached the same level as that of the high-voltage power supply $V_{CC}$, which shortens the time for establishing valid data "1".

The ROM 11 provides the following features:

(1) Each of the cell blocks CBa1, CBa2, CBb1 and CBb2 in the ROM 11 of a NAND type circuit comprises the discharge transistor Tdc, the block select transistor Tbs and the first to third memory transistors Tm1–Tm3, all connected in series. In operating the ROM 11 in fast mode, the discharge transistor Tdc is controlled to be always on by the mode setting circuit 27. In operating the ROM 11 in slow mode, the mode setting circuit 27 controls the discharge transistor Tdc to be off in a precharge operation and controls the transistor Tdc to be on in a read operation. Therefore, data is read from the ROM 11 fast in the fast mode while the current consumption of the ROM 11 is reduced in the slow mode.

(2) The conventional ROM could be used only in two modes, the normal mode for reading data and the standby mode for placing the ROM in a nonoperational state or standby state. In contrast, in reading data, the ROM 11 uses two modes, the fast mode for operating the ROM 11 fast and the slow mode for slowly operating the ROM 11 to suppress current consumption. The ROM 11 can accomplish three operations: the fast mode; the slow mode; and the standby mode.

Although each of the cell blocks CBa1, CBa2, CBb1 and CBb2 comprises three memory transistors in this embodiment, the number may be changed to eight, sixteen and so forth as needed.

Figure 10:
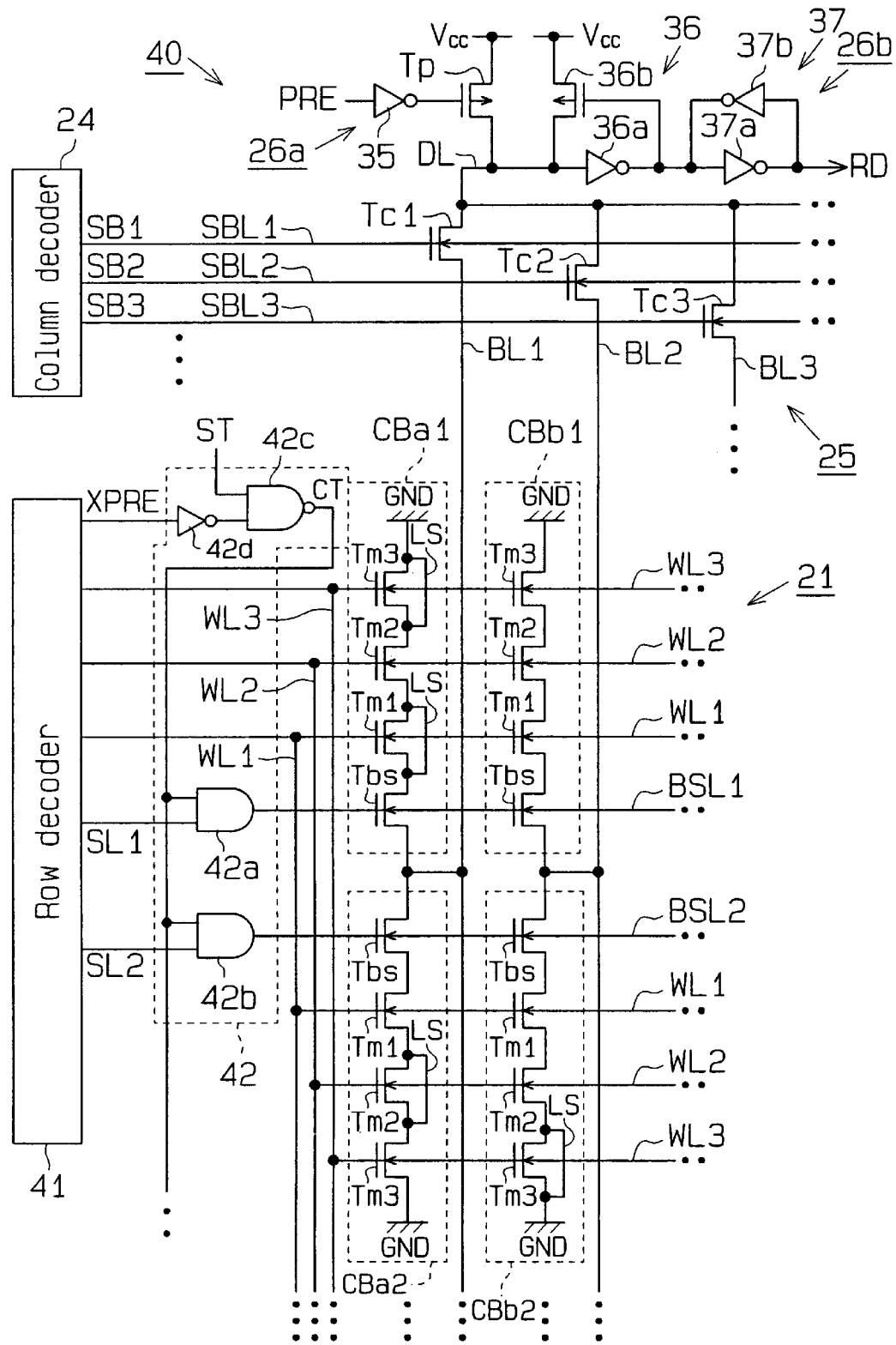
FIG. 10 is a circuit diagram of the essential parts of a ROM according to a second embodiment.

A second embodiment of the present invention will now be described. FIG. 10 shows the essential parts of a ROM 40 according to the second embodiment. The ROM 40 is the same as the ROM 11 of the first embodiment in that it is of a NAND type. The system structure of the ROM 40 is the same as that of the first embodiment, as shown in FIG. 5. The ROM 40 differs from the ROM 11 of the first embodiment in that each cell block has no discharge transistor. For the sake of descriptive convenience, the differences will be discussed in detail and like or same reference numerals are given to common portions to thereby avoid redundant description.

In FIG. 10, each of the cell blocks CBa1, CBa2, CBb1 and CBb2 has a block select transistor Tbs, and first to third memory transistors Tm1 to Tm3.

The first to third memory transistors Tm1–Tm3 in each of the cell blocks CBa1, CBa2, CBb1 and CBb2 are connected in series. The first memory transistor Tm1 has a drain connected to the source of the block select transistor Tbs whose drain is connected to the associated bit line BL1 or BL2. The source of the third memory transistor Tm3 is connected to the low-voltage power supply GND.

Further, each block select transistor Tbs has a gate which is connected to an associated block select line BSL1 or BSL2. Each first memory transistor Tm1 has a gate connected to the first word line WL1. Each second memory transistor Tm2 has a gate connected to the second word line WL2. Each third memory transistor Tm3 has a gate connected to the third word line WL3.

Each cell block CBa1, CBa2, CBb1 or CBb2 is selected as the block select transistor Tbs in that block is turned on. In the selected block, two of the first to third word lines WL1–WL3, which are not selected, become H levels, and the remaining one, selected word line, goes to an L level. The memory transistors connected to the non-selected word lines are turned on, and the memory transistors connected to the selected word line are turned off.

When the source and drain of each disabled memory transistor are short-circuited, i.e., when data in that memory transistor is "0", the series circuit of the first to third memory transistors Tm1–Tm3 becomes conductive. When the source and drain of each disabled memory transistor are not short-circuited, i.e., when data in that memory transistor is "1", on the other hand, the series circuit of the first to third memory transistors Tm1–Tm3 becomes nonconductive.

According to the second embodiment, each of the first and third memory transistors Tm1 and Tm3 in the cell block CBa1, the second memory transistor Tm2 in the cell block CBa2 and the third memory transistor Tm3 in the cell block CBb2 has the source and drain short-circuited by the line LS. Although the cell blocks are shown having predetermined values stored therein, it will be understood by those of ordinary skill in the art that other values may be programmed into the ROM. Accordingly, the cell blocks CBa1–CBb2 having short circuit lines LS are exemplary and not limiting.

A row decoder 41 is connected to the first to third word lines WL1–WL3. The row decoder 41 decodes row address data in synchronism with the clock CLK which is input via the control buffer 28, and generates a word signal and a block select signal for selecting the cell block corresponding to the row address data and the memory transistors in the selected cell block.

When the cell block CBa1 is selected, for example, the row decoder 41 sends, to a mode setting circuit 42 at the succeeding stage, a block select signal SL1 of an H level for setting the block select line BSL1 to an H level, and a block select signal SL2 of an L level for setting the block select line BSL2 to an L level. When the first memory transistor Tm1 in the cell block CBa1 is selected, the row decoder 41 sends an H-level word signal to the second and third word lines WL2 and WL3 and an L-level word signal to the first word line WL1.

The row decoder 41 receives the precharge signal PRE via the control buffer 28. The row decoder 41 generates an inverted signal obtained by inverting the level of the precharge signal PRE, and sends the inverted signal as the discharge signal XPRE to the mode setting circuit 42.

The mode setting circuit 42 includes first and second AND gates 42a and 42b, one NAND gate 42c and one inverter 42d. The inverter 42d inverts the discharge signal XPRE received and sends the inverted signal to the NAND gate 42c. The NAND gate 42c also receives the operation-mode setting signal ST via the control buffer 28.

When the operation-mode setting signal ST indicates the fast mode (at an L level), the NAND gate 42c sends the H-level control signal CT to the first and second AND gates 42a and 42b irrespective of the discharge signal XPRE. When the operation-mode setting signal ST indicates the slow mode (at an H level), the NAND gate 42c sends the L-level control signal CT to the first and second AND gates 42a and 42b when the discharge signal XPRE has the L level, and sends the H-level control signal CT to the AND gates 42a and 42b when the discharge signal XPRE has the H level.

The first AND gate 42a receives the aforementioned block select signal SL1. The output terminal of the first AND gate 42a is connected to the block select line BSL1. The second AND gate 42b receives the aforementioned block select signal SL2, and has its output terminal connected to the block select line BSL2.

As the control signal CT is always at the H level in the fast mode, therefore, the first and second AND gates 42a and 42b respectively send the block select signals SL1 and SL2 directly to the block select lines BSL1 and BSL2.

As the control signal CT has two stages of an H level and an L level in the slow mode, the first and second AND gates 42a and 42b respectively send the block select signals SL1 and SL2 directly to the block select lines BSL1 and BSL2 when the control signal CT has the H level. When the control signal CT has the L level, the first and second AND gates 42a and 42b respectively send L-level signals to the block select lines BSL1 and BSL2, regardless of the block select signals SL1 and SL2.

The operation of the ROM 40 will now be discussed.

Fast Mode

In fast mode, the CPU 12 provides the clock generator 13 with a control signal for permitting the fast operation of the ROM 40 to read data therefrom fast. In response to the control signal, the clock generator 13 sends the clock CLK having a short period and the L-level operation-mode setting signal ST to the ROM 40.

As the L-level operation-mode setting signal ST is supplied to the NAND gate 42c in the mode setting circuit 42 in the ROM 40, the H-level control signal CT is always supplied to the first and second AND gates 42a and 42b from the NAND gate 42c. Therefore, the first and second AND gates 42a and 42b respectively send the block select signals SL1 and SL2 from the row decoder 41 directly to the block select lines BSL1 and BSL2.

A description will now be given of a case where, for example, address data $AD_0$–$AD_n$ for selecting the second memory transistor Tm2 in the cell block CBa2 connected to the bit line BL1 is input to the ROM 40 in the fast mode.

1. Precharge Operation

The column decoder 24 sends the H-level bit-line select signal SB1 to the bit-line select line SBL1, and sends the L-level bit-line select signals SB2 and SB3 to the other bit-line select lines SBL2 and SBL3. As a result, only the bit line BL1 is connected to the data line DL.

The row decoder 41 sends the H-level block select signal SL2 to the block select line BSL2 via the second AND gate 42b, and sends the L-level block select signal SL1 to the block select line BSL1 via the first AND gate 42a. Further, the row decoder 41 sends the H-level word signal to the first and third word lines WL1 and WL3 and sends the L-level word signal to the second word line WL2.

Consequently, the block select transistor Tbs and the first and third memory transistors Tm1 and Tm3 in the cell block CBa2 are turned on. Since the second memory transistor Tm2 in the cell block CBa2 has its source and drain connected by the line LS, the series circuit in the cell block CBa2 is conductive.

Then, the precharge signal PRE is activated, which turns on the precharge transistor Tp, causing the current from the high-voltage power supply $V_{CC}$ to flow into the bit line BL1 via the precharge transistor Tp and the column switch Tc1, and precharging is initiated.

Figure 11:
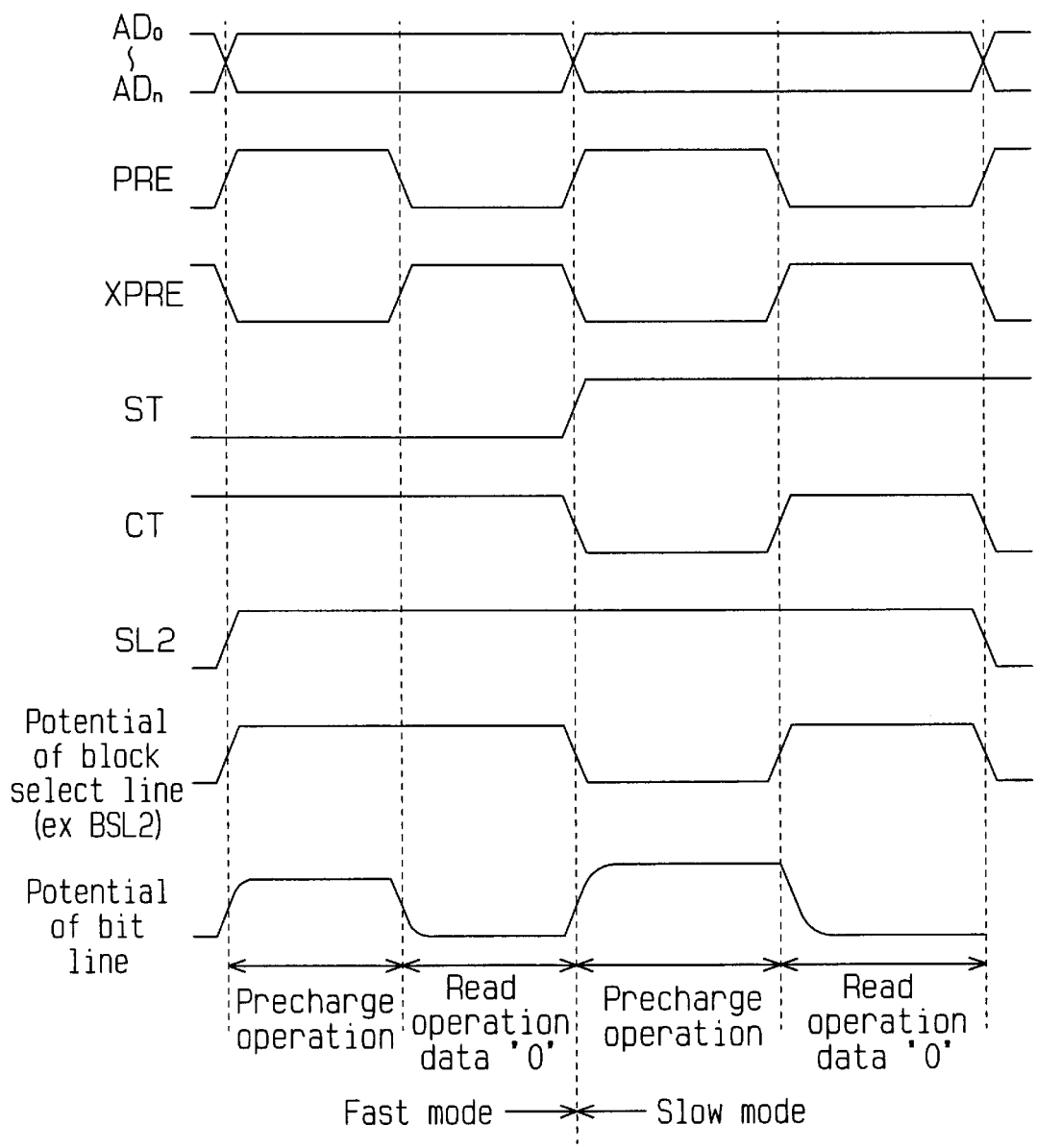
FIG. 11 is a time chart explaining the operation of the ROM of FIG. 10.

As the series circuit in the selected cell block CBa2 is conductive (the data in the selected second memory transistor Tm2 in the cell block CBa2 is "0") at this time, charge in the bit line BL1 is discharged to the level of the low-voltage power supply GND via the cell block CBa2. As shown in FIG. 11, the potential of the bit line BL1, though precharged, stays at a low level and does not become as high a level as the high-voltage power supply $V_{CC}$.

2. Read Operation

When the precharge signal PRE is switched to an L level from the H level, the precharge operation ends and a read operation starts. As the precharge transistor Tp is turned off, the flow of the current to the bit line BL1 from the high-voltage power supply $V_{CC}$ is blocked. Therefore, charge in the bit line BL1 is discharged via the cell block CBa2. Consequently, the potential of the bit line BL1 drops to an L level.

At this time, in the precharge operation, discharging is performed via the selected cell block CBa2 and the potential of the bit line BL1 is at a low level, so that the potential of the bit line BL1 quickly becomes the L level in the read operation. When data "0" is read, therefore, the potential of the bit line BL1 has already dropped low, decreasing the time for establishing data. It is thus possible to carry out data reading associated with the fast mode.

Note that when data "1" is read, no discharge is performed during the precharge operation. The potential of the bit line has therefore reached the same level as that of the high-voltage power supply $V_{CC}$, similarly shortening the time for establishing data "1" and ensuring data reading associated with the fast mode.

When data of "0" is read in fast mode, discharging is executed, thus consuming the current, even in the precharge operation, and the precharging time in fast mode is shorter than the precharging time in slow mode. The current consumed during one cycle in fast mode is therefore smaller than that in the case of reading data of "0" in slow mode.

Slow Mode

In slow mode, the CPU 12 provides the clock generator 13 with a control signal for permitting the slow operation of the ROM 40. In response to the control signal, the clock generator 13 sends the clock CLK having a long or increased period and the H-level operation-mode setting signal ST to the ROM 40.

Since the H-level operation-mode setting signal ST is supplied to the NAND gate 42c in the mode setting circuit 42 in the ROM 40, the NAND gate 42c alternately sends the H-level control signal CT to the first and second AND gates 42a and 42b when the discharge signal XPRE is at the H level (the precharge signal PRE at the L level), and sends the L-level control signal CT to the AND gates 42a and 42b when the discharge signal XPRE is at the L level (the precharge signal PRE at the H level).

In the precharge operation, therefore, the L-level control signal CT is supplied to the first and second AND gate 42a and 42b, setting the block select transistors Tbs of the individual cell blocks CBa1, CBa2, CBb1 and CBb2 off.

A description will now be given of a case where, for example, address data $AD_0$–$AD_n$ for selecting the third memory transistor Tm3 in the cell block CBb2 connected to the bit line BL2 is input to the ROM 40 in the slow mode.

1. Precharge Operation

The column decoder 24 sends the H-level bit-line select signal SB2 to the bit-line select line SBL2, and sends the L-level bit-line select signals SB1 and SB3 to the other bit-line select lines SBL1 and SBL3. As a result, only the bit line BL2 is connected to the data line DL.

The row decoder 41 sends the H-level block select signal SL2 to the second AND gate 42b, and sends the L-level block select signal SL1 to the first AND gate 42a. In the precharge operation, however, the L-level control signal CT is supplied to the first and second AND gates 42a and 42b to turn the block select transistors Tbs of the individual cell blocks CBa1, CBa2, CBb1 and CBb2 off.

Further, the row decoder 41 sends the H-level word signal to the first and second word lines WL1 and WL2 and sends the L-level word signal to the third word line WL3. Consequently, the first and second memory transistors Tm1 and Tm2 in the cell block CBb2 are turned on. The third memory transistor Tm3 in the cell block CBb2 has its source and drain connected by the line LS.

As the precharge transistor Tp is turned on, the current from the high-voltage power supply $V_{CC}$ flows into the bit line BL2 via the precharge transistor Tp and the column switch Tc2, initiating precharging. As the block select transistor Tbs in the selected cell block CBb2 is set off at this time, charge in the bit line BL2 is not discharged to the level of the low-voltage power supply GND via the cell block CBb2. As shown in FIG. 11, therefore, the potential of the bit line BL2 rises and approaches the level of the high-voltage power supply $V_{CC}$.

In the precharge operation in slow mode, therefore, the current which flows from the precharge transistor Tp via the selected cell block CBb2 is not discharged. This can suppress current consumption in the precharge operation.

2. Read Operation

When the precharge signal PRE is switched to an L level from the H level, the precharge operation ends and a read operation starts. When the precharge signal PRE goes to the L level, the precharge transistor Tp is turned off. Further, the control signal CT goes to the H level. The block select transistor Tbs in the cell block CBb2 is turned on.

The OFF action of the precharge transistor Tp inhibits the flow of the current to the bit line BL1 from the high-voltage power supply $V_{CC}$. Since the block select transistor Tbs is controlled and set on to render the series circuit in the selected cell block CBb2 conductive (as the data in the selected third memory transistor Tm3 in the cell block CBb2 is "0"), charge in the bit line BL2 is discharged to the level of the low-voltage power supply GND via the cell block CBb2. Consequently, the potential of the bit line BL2 drops to an L level. When data "0" is read, therefore, the potential of the bit line BL2 is discharged from a high potential close to that of the high-voltage power supply $V_{CC}$, so that the time for establishing data becomes longer than the time required in fast mode. This data-establishing time is however sufficient for reading data in slow mode.

Note that when data "1" is read, no discharge is performed during the precharge operation. The potential of the bit line has therefore reached the same level as that of the high-voltage power supply $V_{CC}$, likewise shortening the time for establishing data "1".

The features of the above-described second embodiment provides the following features:

(1) Each of the cell blocks CBa1, CBa2, CBb1 and CBb2 in the ROM 40 of a NAND type circuit comprises the block select transistor Tbs and the first to third memory transistors Tm1–Tm3, all connected in series. In operating the ROM 40 in fast mode, the block select transistor Tbs is controlled to be always on by the mode setting circuit 42. In operating the ROM 40 in slow mode, the mode setting circuit 42 controls the block select transistor Tbs to be off in a precharge operation and controls the transistor Tbs to be on in a read operation.

Therefore, data can be read from the ROM 40 fast in the fast mode while the current consumption of the ROM 40 is reduced in the slow mode.

(2) The conventional ROM could be used only in two modes, the normal mode for reading data and the standby mode for placing the ROM in a nonoperational state or standby state. In contrast, in reading data, the ROM 40 of the second embodiment can use two modes, the fast mode for operating the ROM 40 fast and the slow mode for slowly operating the ROM 40 to suppress current consumption. That is, the ROM 40 can accomplish three operations: the fast mode, the slow mode, and the standby mode.

The present invention is not limited to the above-described embodiments, but may be embodied in the following forms.

Figure 12:
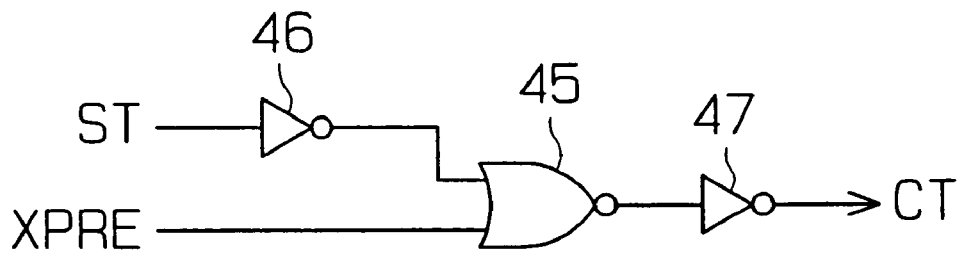
FIG. 12 is a circuit diagram showing another example of the mode setting circuit of FIG. 8.

The mode setting circuit 27 of the first embodiment may be changed as shown in FIG. 12. In FIG. 12, the mode setting circuit has a NOR gate 45 and two inverters 46 and 47. The NOR gate 45 receives the discharge signal XPRE, and the operation-mode setting signal ST via the inverter 46. The output terminal of the NOR gate 45 is connected to the inverter 47, whose output terminal is connected to the control line CL in FIG. 7.

When the operation-mode setting signal ST indicates the fast mode (at an L level), therefore, the inverter 47 outputs the H-level control signal CT irrespective of the level of the discharge signal XPRE. When the operation-mode setting signal ST indicates the slow mode (at an H level), the inverter 47 outputs the L-level control signal CT in accordance with the L-level discharge signal XPRE and outputs the H-level control signal CT in accordance with the H-level discharge signal XPRE.

Figure 13:
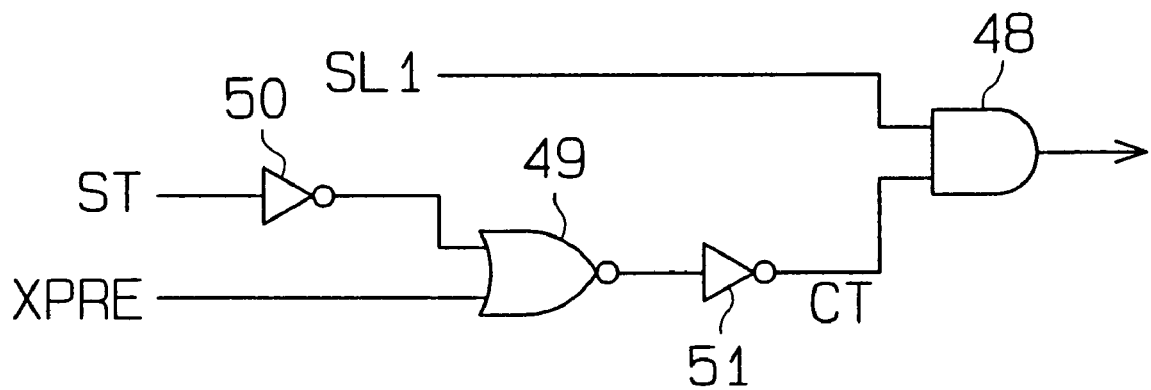
FIG. 13 is a circuit diagram depicting a further example of the mode setting circuit.

The mode setting circuit 42 of the second embodiment may be changed as shown in FIG. 13. For the sake of descriptive convenience, FIG. 13 shows only the mode setting circuit associated with the block select line BSL1. The mode setting circuit shown in FIG. 13 has an AND gate 48, a NOR gate 49 and two inverters 50 and 51.

The NOR gate 49 receives the discharge signal XPRE, and receives the operation-mode setting signal ST via the inverter 50. The output terminal of the NOR gate 49 is connected to the inverter 51, whose output terminal is connected to the AND gate 48. The AND gate 48 has another input terminal which is connected to the row decoder 41 and at which the block select signal SL1 is received. The output terminal of the AND gate 48 is connected to the block select line BSL1.

When the operation-mode setting signal ST indicates the fast mode (at an L level), the inverter 51 sends the H-level control signal CT to the AND gate 48 irrespective of the level of the discharge signal XPRE. When the operation-mode setting signal ST indicates the slow mode (at an H level), the inverter 51 sends the L-level control signal CT to the AND gate 48 when the discharge signal XPRE has an L level, and sends the H-level control signal CT to the AND gate 48 when the discharge signal XPRE has an H level.

In fast mode, the AND gate 48 sends the block select signal SL1 directly to the block select line BSL1. In slow mode, the AND gate 48 sends the block select signal SL1 directly to the block select lines BSL1 and BSL2 when the control signal CT is at an H level. When the control signal CT is at an L level, the AND gate 48 sends an L-level signal to the block select line BSL1, regardless of the block select signal SL1.

Although the present invention is embodied into the ROMs 11 and 40 in the above-described embodiments, the present invention may be adapted to other semiconductor memory devices such as EPROM, EEPROM and RAM.

Although the memory cells are of a NAND type in the above-described embodiments, a semiconductor memory device which takes the form of a NOR type circuit could be used.

It is preferred that the present invention is embodied into a one-chip semiconductor memory device. However, the present invention may be embodied into a semiconductor integrated circuit device on which a memory is installed together with a controller like a one-chip microcontroller.

The present examples and embodiments are to be considered as illustrative and not restrictive and the invention is not to be limited to the details given herein, but may be modified within the scope and equivalence of the appended claims.

What is claimed is:

1. A data reading method for a semiconductor memory device for, after precharging a bit line in response to a precharge signal, determining whether a charge in said precharged bit line is to be discharged based on a data content of a memory cell connected to said precharged bit line and selected by a row decoder, thereby causing said data content of said selected memory cell to be read, said method comprising the steps of:

in a fast data reading mode, enabling discharging of the charge in the bit line during precharging of the bit line based on said data content of said selected memory cell and reading data from said selected memory cell after precharging; and in a slow data reading mode, disabling discharging of the charge in the bit line during precharging of the bit line regardless of said data content of said selected memory cell and reading data from said selected memory cell after precharging.

2. A semiconductor memory device comprising:

a plurality of cell blocks each having at least one memory cell;

a plurality of bit lines for reading data from the individual memory cells;

a precharge circuit for precharging one bit line selected from among said plurality of bit lines in response to a precharge signal, wherein whether a charge in said precharged bit line is to be discharged is determined based on a data content of a memory cell in a cell block selected by a row decoder connected to the bit line, thereby causing said data content of said selected memory cell in said selected cell block to be read;

at least one gate switching element connected in series to said at least one memory cell of each of said cell blocks, said gate switching element together with said at least one memory cell of each cell block forming a circuit having one end connected to an associated one of said bit lines and a second end connected to a low-voltage power supply; and a mode setting circuit for enabling said gate switching element during precharging in a fast data reading mode, and disabling said gate switching element during precharging in a slow data reading mode.

3. The semiconductor memory device according to claim 2, wherein said mode setting circuit receives an operation-mode setting signal and a discharge signal complementary to the precharge signal, and, based on said operation-mode setting signal and said discharge signal, enables said gate switching element during precharging in said fast data reading mode, and disables said gate switching element during precharging in said slow data reading mode.

4. The semiconductor memory device according to claim 3, wherein said gate switching element is a discharge transistor, and said at least one memory cell in each of said cell blocks comprises a plurality of series-connected memory transistors, said discharge transistor being connected in series to said series-connected memory transistors.

5. The semiconductor memory device according to claim 3, wherein said at least one memory cell in each of said cell blocks comprises a plurality of series-connected memory transistors, and said gate switching element is a select transistor for selecting an associated one of said cell blocks, said series-connected memory transistors being connected in series to said select transistor.

6. The semiconductor memory device according to claim 2, wherein said gate switching element is a discharge transistor, and said at least one memory cell in each of said cell blocks comprises a plurality of series-connected memory transistors, said discharge transistor being connected in series to said series-connected memory transistors.

7. The semiconductor memory device according to claim 2, wherein said at least one memory cell in each of said cell blocks comprises a plurality of series-connected memory transistors, and said gate switching element is a select transistor for selecting an associated one of said cell blocks, said series-connected memory transistors being connected in series to said select transistor.

8. A control circuit for a semiconductor memory device, the memory device operating in a fast mode for reading data according to a clock signal having a first period and in a slow mode for reading data according to the clock signal having a second, longer period, the control circuit comprising:

a signal generator for generating the clock signal having the first period and the second period, and an operation mode setting signal for designating to the memory device reading data in the fast mode and the slow mode; and a processing unit for outputting a read enable signal for enabling a read operation of the memory device and a precharge signal for initiating a precharge operation of the memory device.

9. The control circuit of claim 8, further comprising:

a precharge circuit for precharging a selected one of a plurality of bit lines of the memory device in response to the precharge signal, wherein a charge in the selected bit line is discharged based on a data content of a memory cell of a selected cell block of the memory device connected to the bit line, such that the data content of the selected memory cell is read.

* * * * *